United States Patent
Lee

(10) Patent No.: US 8,044,467 B2
(45) Date of Patent: Oct. 25, 2011

(54) SEMICONDUCTOR DEVICE AND METHOD OF FABRICATING THE SAME

(75) Inventor: Byung-Duk Lee, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 34 days.

(21) Appl. No.: 12/344,159

(22) Filed: Dec. 24, 2008

(65) Prior Publication Data
US 2010/0044797 A1 Feb. 25, 2010

(30) Foreign Application Priority Data
Aug. 22, 2008 (KR) .................. 10-2008-0082417

(51) Int. Cl.
H01L 29/78 (2006.01)
(52) U.S. Cl. ........ 257/366; 438/387; 438/396; 438/397; 438/257
(58) Field of Classification Search .......... 257/329–332, 257/388, 407, 412, 413; 438/156, 182, 270–273, 438/589–590, 592
See application file for complete search history.

(56) References Cited

U.S. PATENT DOCUMENTS

| 5,668,039 A * | 9/1997 | Lin .................. 438/387 |
| 6,329,232 B1 * | 12/2001 | Yang et al. .................. 438/197 |
| 7,122,858 B2 * | 10/2006 | Arai et al. .................. 257/320 |
| 2005/0194597 A1 * | 9/2005 | Seo et al. .................. 257/71 |
| 2005/0233584 A1 * | 10/2005 | Jeon et al. .................. 438/675 |
| 2007/0048985 A1 * | 3/2007 | Jawarani et al. .................. 438/581 |
| 2007/0296031 A1 * | 12/2007 | Tanaka .................. 257/330 |

FOREIGN PATENT DOCUMENTS

| KR | 102004008479 | 1/2004 |
| KR | 10-0447980 | 8/2004 |
| KR | 10-0606288 | 7/2006 |
| KR | 10-0642761 | 10/2006 |
| KR | 1020100004649 | 1/2010 |

OTHER PUBLICATIONS

Office Action dated Sep. 7, 2010, for Korean application No. 10-2008-0082417.

* cited by examiner

*Primary Examiner* — Wai-Sing Louie
*Assistant Examiner* — Sue Tang
(74) *Attorney, Agent, or Firm* — Lowe Hauptman Ham & Berner LLP

(57) ABSTRACT

A semiconductor device with reduced contact resistance between a substrate and a plug includes a gate electrode disposed over the substrate, the plug formed over the substrate at both sides of the gate electrode and having a sidewall with a positive slope, a capping layer disposed between the gate electrode and the plug, and a gate hard mask layer whose sidewall disposed over the gate electrode is extended to a top surface of the capping layer. By employing the capping layer having a sidewall with a negative slope, the plug having the sidewall with a positive slope can be formed regardless of a shape or profile of the sidewall of the gate electrode. As a result, the contact area between the substrate and the plug is increased.

15 Claims, 7 Drawing Sheets

SEMICONDUCTOR DEVICE AND METHOD OF FABRICATING THE SAME

CROSS-REFERENCE TO RELATED APPLICATIONS

The present invention claims priority of Korean patent application number 10-2008-0082417, filed on Aug. 22, 2008, which is incorporated herein by reference in its entirety.

BACKGROUND

One or more embodiments relate to the technology of fabricating a semiconductor device, and more particularly, to a semiconductor device with reduced contact resistance between a substrate and a plug, and a method of fabricating the semiconductor device.

As the degree of integration of semiconductor devices increases, a space between gate patterns becomes narrow and thus a contact processing margin reduces. Therefore, in order to secure a desired contact processing margin, a landing plug contact (LPC) structure is commonly used.

A landing plug contact process is accomplished by filling a space between gate patterns where, previously, a bit line contact and a storage contact are formed with a conductive layer to secure an overlay margin in subsequent contact processes.

FIG. 1 illustrates a cross-sectional view of a conventional semiconductor device.

Referring to FIG. 1, a gate 17 is formed by sequentially stacking a gate insulation layer 14, a gate electrode 15 and a gate hard mask layer 16 over a substrate 11 including a device isolation region 12 and an active region 13, and then etching the gate insulation layer 14, the gate electrode 15 and the gate hard mask layer 16 at once by using a gate mask. Then, after forming gate spacers 18 on sidewalls of the gate 17, a source and drain region (not shown) is formed in the active region 13 between two neighboring gates 17.

After depositing an interlayer insulation layer (not shown) covering the resultant structure, the deposited interlayer insulation layer undergoes a photolithography process and an etching process using a contact mask as an etch barrier. As a result, a contact hole is formed. The contact hole is then filled with a conductive layer, thereby forming a landing plug 19.

However, during the formation of the gate 17, since etch rates of the gate insulation layer 14, the gate electrode 15 and the gate hard mask layer 16 with respect to an etching gas are different from each other, the resultant gate 17 is formed having a sidewall with a positive slope. That is, a bottom line width (bottom CD) W2 of the gate 17 is greater than its top CD W1 (W1<W2). Therefore, a space between two neighboring gates 17 is reduced and thus a contact area between the landing plug 19 and the substrate 11 is also reduced. The reduction of the contact area between the landing plug 19 and the substrate 11 becomes a more serious issue as the gate spacers 18 are formed. Byproduces or residues R generated during formation of the gate 17 may further reduce the contact area between the landing plug 19 and the substrate 11.

As described above, when the contact area between the landing plug 19 and the substrate 11 is reduced, the contact resistance between the landing plug 19 and the substrate 11 is increased, thus, the operational speed of the semiconductor device deteriorates.

SUMMARY

One or more embodiments are directed to a semiconductor device capable of reducing contact resistance between a landing plug and a substrate by increasing a contact area between the landing plug and the substrate, and a method for fabricating the semiconductor device.

One or more embodiments are directed to a semiconductor device including a gate electrode disposed over a substrate; a plug formed over the substrate at both sides of the gate electrode and having a sidewall with a positive slope; a capping layer disposed between the gate electrode and the plug; and a gate hard mask layer whose sidewall disposed over the gate electrode is extended to a top surface of the capping layer.

A sidewall of the gate electrode may have a vertical profile or a positive slope and a sidewall of the capping layer may have a negative slope.

One or more embodiments are directed to a method for fabricating a semiconductor device, the method including forming a conductive layer over a substrate; selectively etching the conductive layer to simultaneously form a gate electrode and a plug whose sidewall has a positive slope; forming a capping layer between the plug and the gate electrode; and forming a gate hard mask layer over the gate electrode, wherein a sidewall of the gate hard mask layer is extended to a top surface of the capping layer. At this time, a sidewall of the capping layer may have a negative slope.

The method may further include selectively etching the substrate to form a recess pattern before forming the conductive layer.

Simultaneously forming the gate electrode and the plug may include forming a photoresist pattern over the conductive layer; and etching the conductive layer using the photoresist pattern as an etch barrier to form a trench having a sidewall with a negative slope.

One or more embodiments are directed to a method of fabricating a semiconductor device, the method includes forming a first conductive layer over a substrate; selectively etching the first conductive layer to simultaneously form a first gate electrode and a plug whose sidewall has a positive slope; forming a capping layer between the plug and the first gate electrode; recessing the plug and the first gate electrode by a certain thickness using the capping layer as an etch barrier, thereby forming a resultant structure; sequentially forming a barrier metal layer and a second conductive layer over a whole surface of the resultant structure; performing a planarization process until the capping layer is exposed, thereby forming a second gate electrode; and forming a gate hard mask layer over the second gate electrode that is formed over the first gate electrode, wherein a sidewall of the gate hard mask layer is extended to a top surface of the capping layer. Herein, a sidewall of the capping layer may have a negative slope.

The method may further include removing the second gate electrode and the barrier metal layer formed over the plug using the gate hard mask layer and the capping layer as an etch barrier.

The method may further include selectively etching the substrate to form a recess pattern before forming the first conductive layer.

Simultaneously forming the first gate electrode and the plug may include forming a photoresist pattern over the first conductive layer; and etching the first conductive layer using the photoresist pattern as an etch barrier to form a trench having a sidewall with a negative slope.

Figure 1:
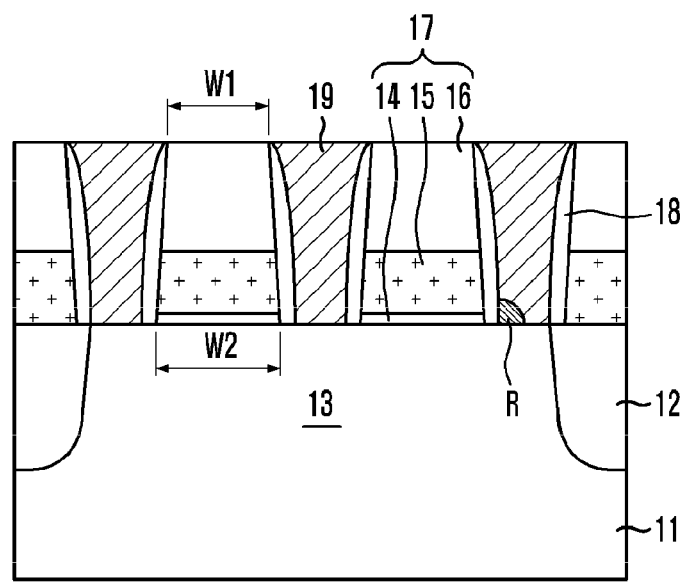
FIG. 1 illustrates a cross-sectional view of a conventional semiconductor device.

Other objects and advantages of one or more embodiments can be understood by the following description, and become apparent with reference to these embodiments. In the figures, the dimensions of layers and regions are exaggerated for clarity of illustration. Like reference numerals refer to like elements throughout. It will also be understood that when a layer is referred to as being 'on'/'under' another one, it can be directly on/under the other one, or one or more intervening layers may also be present. In addition, it will also be understood that when a layer is referred to as being 'between' two layers, it can be the only layer between the two layers, or one or more intervening layers may also be present.

DESCRIPTION OF EMBODIMENTS

One or more embodiments are directed to a semiconductor device with reduced contact resistance between a plug, e.g., a landing plug, and a substrate by increasing a contact area between the plug and the substrate, and a method for fabricating the semiconductor device. For this purpose, the embodiments employ a technical principle where a gate electrode and a plug are simultaneously formed instead of forming the plug after the gate electrode is formed.

Figure 2:
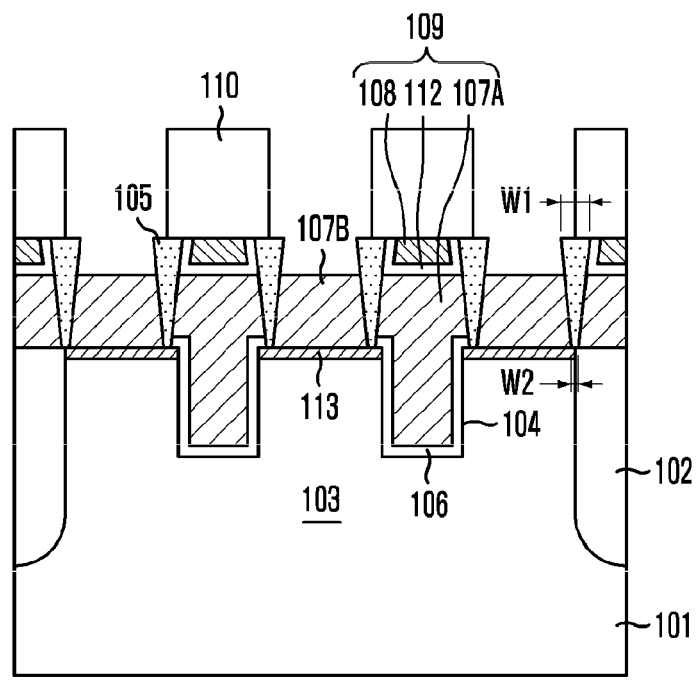
FIG. 2 illustrates a cross-sectional view of a semiconductor device of one embodiment.

Hereinafter, one embodiment will be described with reference to a case that the above technical principle is applied to a semiconductor device that includes a gate electrode having a stack structure, e.g., a poly-metal structure. FIG. 2 illustrates a cross-sectional view of the semiconductor device of the one embodiment.

Referring to FIG. 2, the semiconductor device includes a gate oxide layer 106 on a substrate 101, a gate electrode 109 formed on the gate oxide layer 106, a plug 107B formed on the substrate 101 between two neighboring gate electrodes 109 and having a sidewall with a positive slope, a capping layer 105 disposed between the gate electrode 109 and the plug 107B, and a gate hard mask layer 110 formed on the gate electrode 109 and having a sidewall extended to a top surface of the capping layer 105. Herein, a structure having a sidewall with a positive slope is represented by a structure with an increasing line width from an upper portion to a lower portion thereof. On the other hand, a structure having a sidewall with a negative slope is represented by a structure with reducing line width from an upper portion to a lower portion thereof.

The semiconductor device may further include a recess pattern 104 formed in the substrate 101 under the gate electrode 109. The recess pattern 104 has one shape selected from the group consisting of rectangle, polygon, a bulb type, a fin type and a saddle-fin type. The bulb type means a recess pattern whose lower portion is wider than its upper portion and, generally, the lower portion has a circular shape. The saddle-fin type means a recess pattern whose bottom surface has a prominence such as a fin.

The capping layer 105 electrically separates the gate electrode 109 and the plug 107B. That is, the capping layer 105 acts as an insulator between the electrode 109 and the plug 107B. Therefore, the capping layer 105 may include one of an oxide layer, a nitride layer and an oxynitride layer, or a stack structure of the above layers. The oxide layer may include one of a silicon dioxide ($SiO_2$) layer, a boron phosphorus silicate glass (BPSG) layer, a phosphorus silicate glass (PSG) layer, a tetra ethyl ortho silicate (TEOS) layer, an un-doped silicate glass (USG) layer, a high density plasma (HDP) layer, a spin on glass (SOG) layer and a spin on dielectric (SOD) layer. The nitride layer may include a silicon nitride ($Si_3N_4$) layer. The oxynitride layer may include a silicon oxynitride (SiON) layer.

Moreover, the capping layer 105 provides the plug 107B having the sidewall with the positive slope. For this, the capping layer 105 may have an upper portion whose line width W1 is greater than a line width W2 of a lower portion, giving a sidewall a negative slope. As a result, the plug 107B can have the sidewall with the positive slope regardless of a shape of a sidewall of the gate electrode 109. When the sidewall of the plug 107B has the positive slope, a contact area between the substrate 101 and the plug 107B can be increased. Likewise, by employing a capping layer 105 with sidewalls having a negative slope, it is possible to increase the contact area between the substrate 101 and the plug 107B regardless of the shape of the sidewall of the gate electrode 109. This will be described in detail with reference to FIGS. 4A to 5B.

The gate electrode 109 may have a line shape crossing both of a device isolation region 102 and an active region 103 and the sidewall of the gate electrode 109 may have a vertical profile or the positive slope. Herein, the gate electrode may include a first gate electrode 107A that fills the recess pattern 104 and includes a portion protruding over the substrate 101, and a second gate electrode 108 disposed between the first gate electrode 107A and the gate hard mask layer 110.

The first gate electrode 107A may include a silicon layer such as a polysilicon layer or a silicon germanium (SiGe) layer, which may be doped with impurities to improve the conductivity of the first gate electrode 107A. The second gate electrode 108 may include a metallic layer with better conductivity than the first electrode 107A for reducing the total resistance of the gate electrode 109. The metallic layer may include a tungsten (W) layer, an aluminum (Al) layer, an iridium oxide ($IrO_2$) layer, a titanium silicide (TiSi) layer, a tungsten silicide (WSi) layer, an indium tin oxide (ITO) layer, an indium zinc oxide (IZO) layer or the like.

The gate electrode 109 may further include a barrier metal layer 112 disposed between the first gate electrode 107A and the second gate electrode 108. The barrier metal layer 112 prevents the second gate electrode 108 from being oxidized during processes as well as preventing the diffusion between the second gate electrode 108 and the first gate electrode 107A.

The barrier metal layer 112 may have a structure that extends into the space between the second gate electrode 108 and the capping layer 105. That is, the barrier metal layer 112 and the capping layer 105, together prevent oxidation of the second gate electrode 108 formed of the metallic layer.

The barrier metal layer 112 may include a heat resistant metal such as titanium (Ti), cobalt (Co), molybdenum (Mo), platinum (Pt), iridium (Ir), ruthenium (Ru), chrome (Cr), tantalum (Ta) or zirconium (Zr). The barrier metal layer 112 may include a metal nitride layer formed by combining the above heat resistant metal with nitride (N), e.g., a titanium nitride (TiN) layer.

The plug 107B may be formed of the same material as that of the first gate electrode 107A. Furthermore, the top surface of the plug 107B and a top surface of the first gate electrode 107A may be disposed on a common plane.

Herein, the reason why the plug 107B is formed of the same material as that of the first gate electrode 107A and the top surfaces of the plug 107B and the first gate electrode 107A are disposed on a common plane is that the first gate electrode 107A and the plug 107B are simultaneously formed to prevent problems that may be caused by forming the plug 107B after forming the gate electrode 109. By forming the plug 107B after forming the gate electrode 109, the contact area between the plug 107B and the substrate 101 may be reduced by byproducts or residues generated during etching of the gate electrode 109, or the contact area between the plug 107B and the substrate 101 may be reduced by the positive slope of the sidewall of the gate electrode 109.

Regardless of the shape of the sidewall of the gate electrode 109, the sidewall of the plug 107B may have the positive slope by meshing with the negative slope of the sidewall of the capping layer 105. Through this, the contact area between the substrate 101 and the plug 107B is increased and thus the contact resistance between the substrate 101 and the plug 107B is reduced.

The plug 107B also provides a source and drain region 113 having a shallow junction, allowing the plug 107B to function as an elevated source/drain (ESD). This is possible by diffusing impurities into the plug 107B to form the source and drain region 113 and it will be described in detail with reference to a method of fabricating the semiconductor device of the yet another embodiment. The structure of the elevated source/drain is designed for reducing its resistance by providing the source and drain region 113 with a high doping concentration as well as reducing a junction depth of the source and drain region 113. Thus, it is possible to restrain a short channel effect (SCE) that may be caused as the semiconductor device becomes more highly integrated.

Although it is not shown in figures, the plug 107B further includes a conductive layer formed thereon to fill a space between two neighboring gate hard mask layers 110. Herein, the plug 107B and the conductive layer formed thereon.

The substrate 101 may include the device isolation region 102 and the active region 103, and the device isolation region 102 may be formed of an oxide layer by performing a shallow trench isolation (STI) process.

The gate hard mask layer 110 functions to protect the gate electrode 109 during various fabrication processes and may include a single layer selected from the group consisting of an oxide layer, a nitride layer and an oxynitride layer, or a stack structure of the above layers.

By forming the capping layer 105 with a sidewall having a negative slope on both sidewalls of the gate electrode 109, the plug 107B can be formed with sidewalls having positive slope regardless of the sidewall shape or profile of the gate electrode 109. As a result, the contact area between the substrate 101 and the plug 107B is increased and thus the contact resistance between the substrate 101 and the plug 107B may be reduced, resulting in improved operational speed of the semiconductor device.

Moreover, the barrier metal layer 112, which is disposed between the second gate electrode 108 and the capping layer 105, together with the capping layer 105 effectively prevents oxidation of the second gate electrode 108 formed of the metallic layer.

Figure 3:
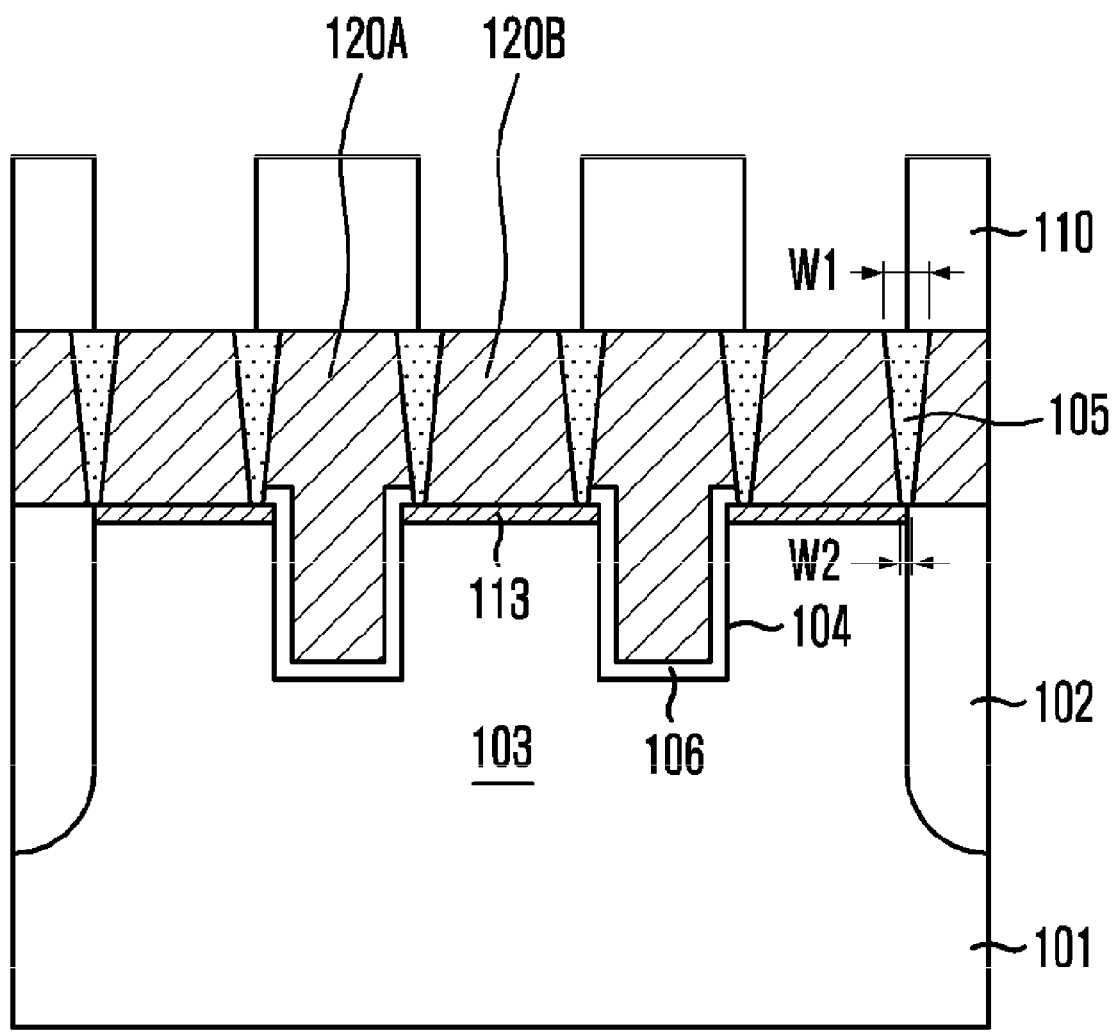
FIG. 3 illustrates a cross-sectional view of a semiconductor device of another embodiment

Hereinafter, another embodiment is directed to a semiconductor device that includes a gate electrode formed of a single layer, and will be described hereafter. In the one and another embodiments, the same components are represented by the same reference numerals and, herein, the detailed description for the same components is omitted. FIG. 3 illustrates a cross-sectional view of the semiconductor device of the another embodiment.

Referring to FIG. 3, the semiconductor device includes a gate oxide layer 106 disposed on a substrate 101, a gate electrode 120A disposed on the gate oxide layer 106, a plug 120B formed on the substrate 101 at both sides of the gate electrode 120A and having a sidewall with a positive slope, a capping layer 105 disposed between the gate electrode 120A and the plug 120B, and a gate hard mask layer 110 formed on the gate electrode 120A and having a sidewall extending to a top surface of the capping layer 105. The semiconductor device may further include a recess pattern 104 formed in the substrate 101 under the gate electrode 120A.

The gate electrode 120A may be formed of a signal layer including a silicon layer or a metallic layer. The silicon layer may include a polysilicon layer, a silicon germanium (SiGe) layer and so on. The metallic layer may include a tungsten (W) layer, an aluminum (Al) layer, a titanium nitride (TiN) layer, an iridium oxide ($IrO_2$) layer, a titanium silicide (TiSi) layer, a tungsten silicide (WSi) layer, an indium tin oxide (ITO) layer, an indium zinc oxide (IZO) layer and so on. Herein, if the gate electrode 120A is formed of the silicon layer, i.e., the polysilicon layer or the silicon germanium layer, the silicon layer may be doped with impurities to improve the conductivity of the gate electrode 120A.

The plug 120B may be formed of the same material as that of the gate electrode 120A. Furthermore, the top surfaces of the plug 120B and the gate electrode 120A may be disposed on a common plane. This is due to the gate electrode 120A and the plug 120B being simultaneously formed to avoid problems caused by forming the plug 120B after forming the gate electrode 120A. If the gate electrode 120A is formed and then the plug 120B is formed thereafter, a contact area between the plug 120B and the substrate 101 may be reduced by byproducts or residues generated in an etching process for the patterning of the gate electrode 120A, or the contact area between the plug 120B and the substrate 101 may be reduced since a sidewall profile of the gate electrode 120A has a positive slope.

Although it is not shown in figures, the semiconductor device may further include a conductive layer formed on the plug 120B that fills a space between two neighboring gate hard mask layers 110. At this time, the plug 120B and the conductive layer formed on the plug 120B act as a landing plug.

The capping layer 105 electrically separates the gate electrode 120A and the plug 120B, acting as an insulator. Therefore, the capping layer 105 may include one of an oxide layer, a nitride layer and an oxynitride layer, or a stack structure of the above layers.

Moreover, the shape of the capping layer 105 provides the plug 120B with sidewalls having a positive slope. For this, the capping layer 105 may have an upper portion whose line width W1 is greater than a line width W2 of a lower portion, giving the sidewalls of the capping layer 105 a negative slope. As a result, the plug 120B can have a sidewall with a positive slope regardless of the shape or profile of the sidewall of the gate electrode 120A. Accordingly, the contact area between the substrate 101 and the plug 120B can be increased and thus contact resistance between the substrate 101 and the plug 120B is reduced. This will be described in detail with reference to FIGS. 4A to 5B.

FIGS. 4A to 5B illustrate cross-sectional views for comparison of a contact area between a substrate and a landing plug of the conventional semiconductor device with that of a semiconductor device of one or more of the embodiments.

Figure 4A:
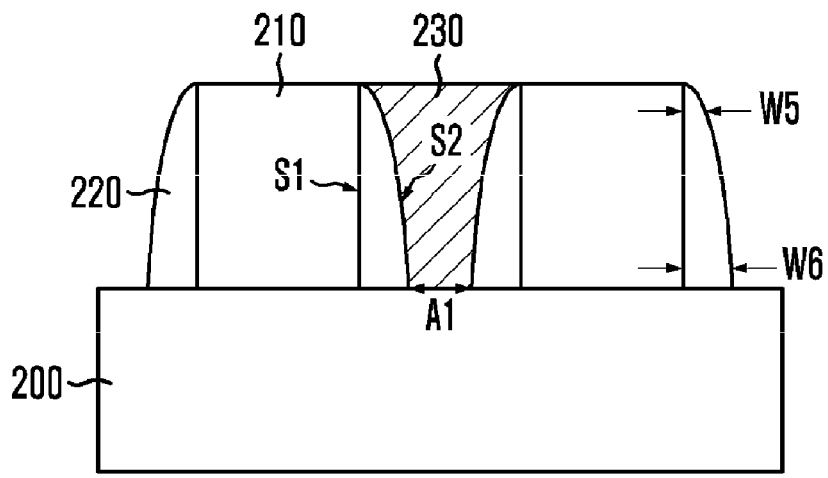
FIGS. 4A to 5B illustrate cross-sectional views of comparing a contact area between a substrate and a landing plug of the conventional semiconductor device with that of a semiconductor device of the one embodiment.
Figure 4B:
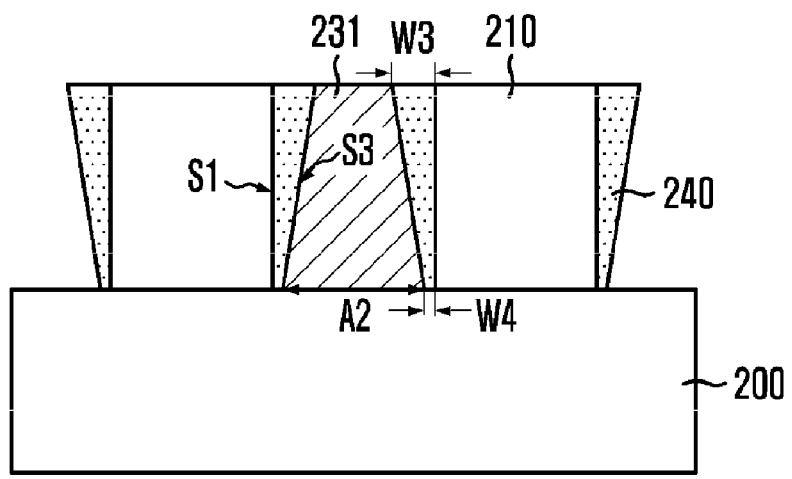
Figure 5A:
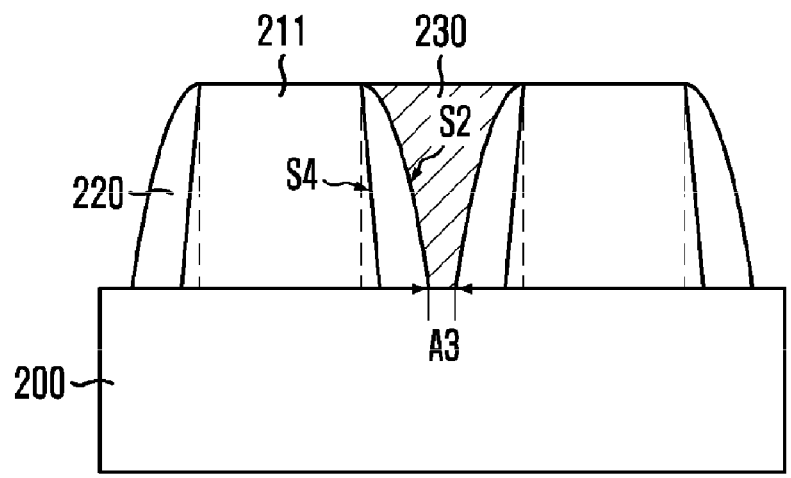
Figure 5B:
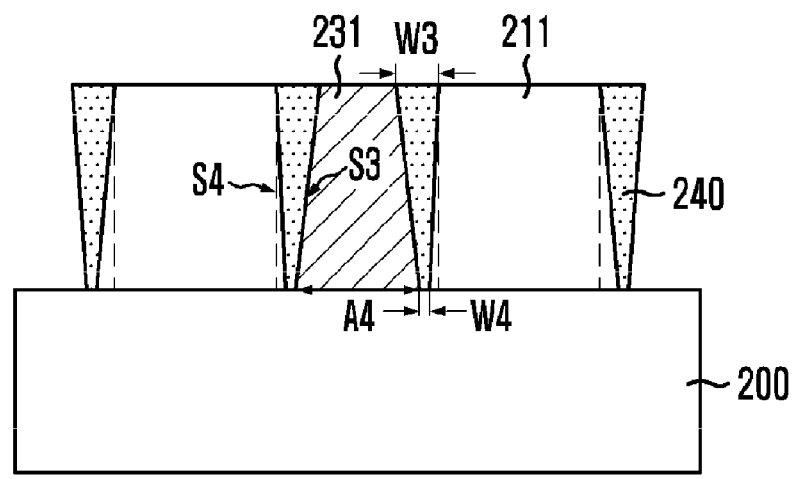

Herein, FIGS. 4A and 4B illustrate cross-sectional views of gate electrodes whose sidewalls have a vertical profile and FIGS. 5A and 5B illustrate cross-sectional views of gate electrodes whose sidewalls have a positive slope.

Referring to FIGS. 4A and 4B, the contact area A2 between a substrate 200 and a plug 231 with the capping layers 240 having sidewalls S3 with a negative slope, formed on both sidewalls of gate electrode 210 with sidewalls S1 having vertical profiles, greater than the contact area A1 between the substrate 200 and a plug 230, with the gate spacers 220 formed on both sidewalls of the gate electrode 210 with sidewalls S1 having the vertical profiles according to the prior art, i.e. (A1<A2). Herein, in the capping layer 240 having the sidewalls with negative slopes has a line width that gets reduced going from an upper portion to a lower portion thereof, i.e. (W3>W4).

In general, the gate spacer 220 according to the prior art is uniformly formed along a profile of the sidewall S1 of the gate electrode 210. Therefore, the sidewall S2 of the plug 230 has a vertical profile or a negative slope according to the profile of the sidewall S1 of the gate electrode 210. Herein, the etching process for forming the gate spacer 220 creates an increasing line with from an upper portion to a lower portion thereof, giving the sidewall S2 of the plug 230 a negative slope, i.e., the sidewall of the gate spacer 220 has the positive slope (W5<W6). As a result, the contact area between the substrate 200 and the plug 230 is reduced by as much as a thickness of the gate spacer 220.

In contrast, since the capping layer 240 has a sidewall with a negative slope, the sidewall of the plug 231 may have the positive slope despite the sidewall S1 of the gate electrode 210 having a vertical profile. Thus, an increase in the contact area A2 between the substrate 200 and the plug 231 is possible.

Referring to FIGS. 5A and 5B, the contact area A4 between a substrate 200 and a plug 231 with the capping layers 240 having sidewalls with a negative slope formed on both sidewalls of a gate electrode 211 whose sidewall S4 has a positive slope is greater than the contact area A3 between the substrate 200 and a plug 230, with the gate spacers 220 are formed on both sidewalls of the gate electrode 211 whose sidewall S4 has the positive slope according to the prior art, i.e. (A4>A3).

Since the gate spacer 220 according to the prior art is uniformly formed along a profile of the sidewall S4 of the gate electrode 211, the sidewall S2 of the plug 230 has the negative slope, thus, the contact area A3 between the substrate 200 and the plug 230 is reduced by as much as a combination of the thickness of the gate spacer 220 and the thickness increased by changing the slope of the sidewall of the gate electrode 211.

In contrast, since the capping layer 240 has a sidewall with a negative slope, the sidewall S3 of the plug 231 may have a positive slope despite the sidewall S4 of the gate electrode 211 also having a positive slope. As a result, it is possible to increase the contact area A4 between the substrate 200 and the plug 231.

After all, since, in the conventional semiconductor device, the gate spacer 220 is formed along the profile of the sidewall S1 or S4 of the gate electrode 210 or 211, the profile of the sidewall S2 of the plug 230 is determined by the profile of the sidewall S1 or S4 of the gate electrode 210 or 211.

In contrast, the semiconductor device of this embodiment includes the capping layer 240 having a sidewall with a negative slope. Therefore, it is possible to form the plug 231 with a sidewall S3 having a positive slope regardless of the profile of the sidewall S1 or S4 of the gate electrode 210 or 211. As a result, the contact area A2 or A4 between the substrate 200 and the plug 231 may be increased. Therefore, the contact resistance between the substrate 200 and the plug 231 may be reduced and the operational speed of the semiconductor device may be improved.

Hereinafter, a method of fabricating a semiconductor device one or more embodiments will be described in detail with reference to accompanying figures.

FIGS. 6A to 6F illustrate cross-sectional views of a method of fabricating a semiconductor device of the yet another embodiment. Herein, a method of fabricating the semiconductor device illustrated in FIG. 2 will be exemplarily described.

Figure 6A:
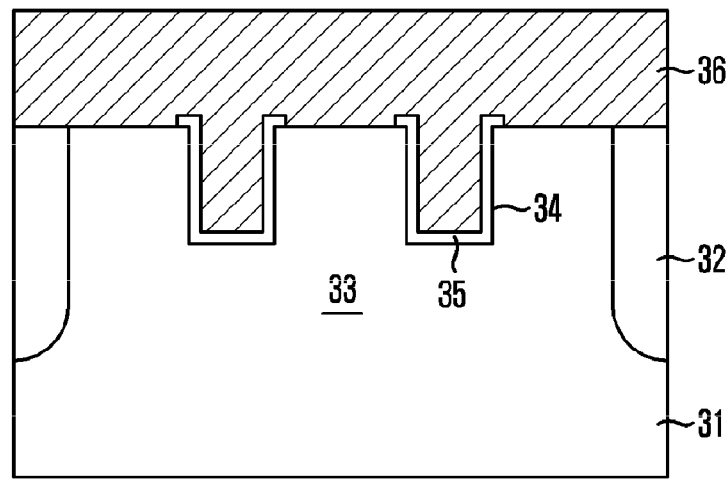
FIGS. 6A to 6F illustrate cross-sectional views of a method of fabricating a semiconductor device of yet another embodiment.

Referring to FIG. 6A, after forming a trench for device isolation in a substrate 31, a device isolation layer 32 is formed by filling the trench with an insulation material. The device isolation layer 32 may include an oxide layer such as a high density plasma (HDP) oxide layer, a spin on dielectric (SOD) layer, or a stack layer of the SOD layer or the HDP oxide layer.

Herein, a region where the device isolation layer 32 is formed in the substrate 31 is referred to as a device isolation region and a region where the device isolation layer 32 is not formed in the substrate 31 is referred to as an active region 33.

Then, after forming a hard mask pattern (not shown) over the substrate 31, a portion of the substrate 31 where a gate is to be formed is recessed using the hard mask pattern as an etch barrier, thereby forming a recess pattern 34.

The recess pattern 34 may be formed having a shape selected from the group consisting of rectangular, polygonal, a bulb type, a fin type and a saddle-fin type. The bulb type refers to a recess pattern whose lower portion is wider than its upper portion and, generally, the lower portion has a circular shape. The saddle-fin type refers to a recess pattern whose bottom surface has a prominence such as a fin.

Subsequently, a gate insulation layer 35 is selectively formed on a portion of the substrate 31 where the gate is to be formed. The gate insulation layer 35 may include an oxide layer such as a silicon dioxide ($SiO_2$) layer and the silicon dioxide layer may be formed through thermal oxidation.

A method for forming the gate insulation layer 35 on the portion of the substrate 31 where the gate is to be formed may be performed by forming an insulation layer over the entire surface of the substrate 31 and etching the insulation layer, leaving the insulation layer only on the region where the gate is to be formed.

Another method of selectively forming the gate insulation layer 35 on the portion of the substrate 31 where the gate is to be formed may be performed by forming a sacrificial pattern to expose the region where the gate is to be formed, depositing an insulation layer on a whole surface of the substrate 31, and removing the insulation layer from portions of the substrate 31 where a gate is not to be formed as well as removing the sacrificial pattern.

A first conductive layer 36 is formed covering a top surface of the substrate 31 and filling the recess pattern 34. The first conductive layer 36 may be formed of a silicon layer that has an excellent interfacial property to the substrate 31 and the gate insulation layer 35. The silicon layer may include a polysilicon layer or a silicon germanium (SiGe) layer. Preferably, the first conductive layer 36 may be formed of a silicon layer that is doped with impurities to improve the conductivity thereof. At this time, the doped silicon layer may be formed by doping the impurities in-situ during the deposition process or doping the impurities ex-situ after the deposition process.

Figure 6B:
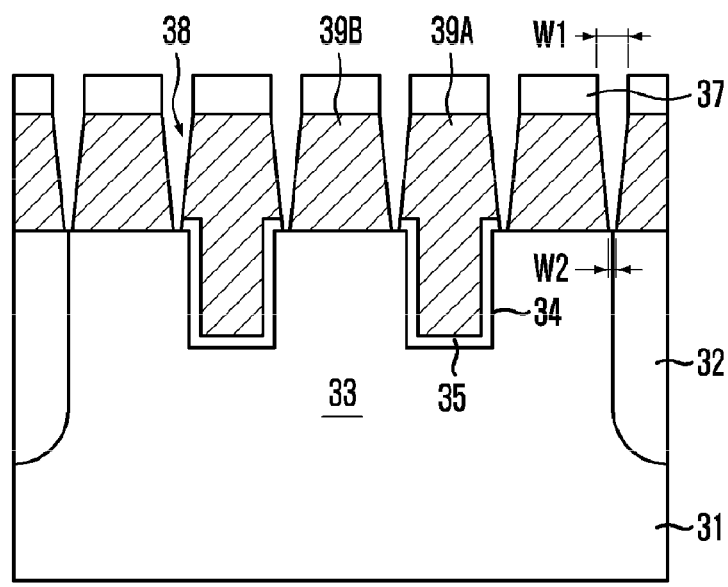

Referring to FIG. 6B, a photoresist pattern 37 is formed on the first conductive layer 36. The photoresist pattern 37 may be formed to cover the region where the gate is to be formed and a region where a landing plug is to be formed in subsequent processes. For instance, after coating photoresist on the first conductive layer 36, a first exposure process is performed using a gate mask. Then, after performing a second exposure process using a landing plug contact mask, a developing process is performed to form the photoresist pattern 37.

A trench 38 having a sidewall with a negative slope is formed by etching the first conductive layer 36 using the photoresist pattern 37 as an etch barrier. As a result, a plug 39B having a sidewall with a positive slope may be formed at the same time of forming a first gate electrode 39A. At this time, in the trench 38 having the sidewall with the negative slope, a line width reduces from an upper portion to a lower portion thereof (W1>W2). The trench 38 may be formed to expose the substrate 31 so as to electrically isolate the plug 39B with the first gate electrode 39A.

The first gate electrode 39A may be formed to have a line shape crossing both of the active region 33 and the device isolation layer 32 at the same time. Since the trench 38 is formed to have the sidewall with the negative slope, the sidewall of the plug 39B has the positive slope. Therefore, it is possible to increase a contact area between the plug 39B and the substrate 31 and to reduce contact resistance between the plug 39B and the substrate 31, referring to FIGS. 4A to 5B.

The trench 38 having the sidewall with the negative slope provides a region to form a subsequent capping layer. Herein, the reason why the trench 38 is formed to have the sidewall with the negative slope, i.e., the trench 38 is formed to have an upper portion having a line width W1 greater than a line width W2 of a lower portion thereof, is to form a capping layer filling the trench 38 to have a sidewall with a negative slope in a subsequent process or the plug 39B to have the sidewall with the positive slope.

The etching process of forming the trench 38 having the sidewall with the negative slope is performed using dry etching such as plasma etching. Herein, a plasma etch apparatus used to form the trench 38 having the sidewall with the negative slope may include an inductively coupled plasma (ICP), an electron cyclotron resonance (ECR), a microwave or a capacitively coupled plasma (CCP) apparatus. In order to adjust an etch profile, a ratio of etch gases, a source power, a bias power, a pressure, or temperatures of a top electrode and a bottom electrode can be adjusted.

For instance, in case that the first conductive layer 36 includes the polysilicon layer, a mixed gas of $CF_4/O_2/Ar$ is used as an etch gas. If applying a bias power in the range of approximately 10 W to approximately 100 W lower than a bias power required in forming a trench having a sidewall with a vertical profile, the trench 38 having the sidewall with the negative slope can be formed as the straightness of positive ions in plasma is reduced.

Figure 6C:
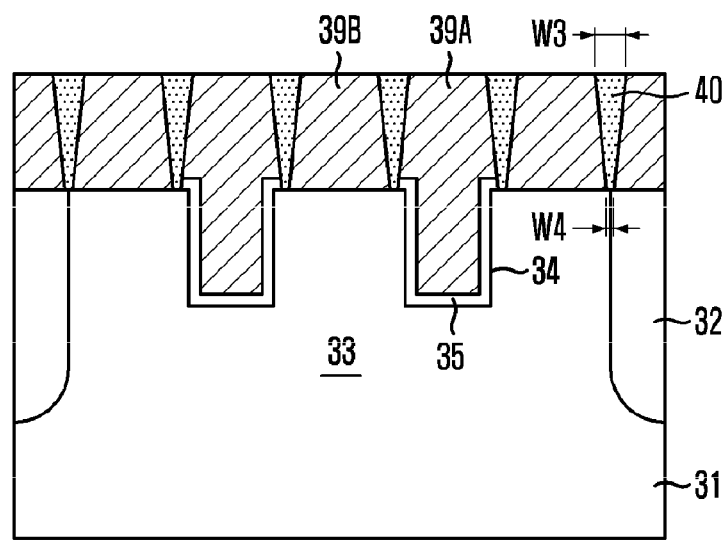

Referring to FIG. 6C, after removing the photoresist pattern 37, a capping layer 40 is formed by filling the trench 38 with an insulation material. Since the capping layer 40 is formed by filling the trench 38 with also the sidewall having a negative slope, a sidewall of the capping layer 40 has a negative slope.

The capping layer 40 protects a gate electrode during subsequent processes and electrically insulates the gate electrode from the plug 39B. Therefore, the capping layer 40 may include one of an oxide layer, a nitride layer and an oxynitride layer, or a stack structure of the above layers. The oxide layer may include one of a silicon dioxide ($SiO_2$) layer, a boron phosphorus silicate glass (BPSG) layer, a phosphorus silicate glass (PSG) layer, a tetra ethyl ortho silicate (TEOS) layer, an un-doped silicate glass (USG) layer, a high density plasma (HDP) layer, a spin on glass (SOG) layer and a spin on dielectric (SOD) layer. The nitride layer may include a silicon nitride ($Si_3N_4$) layer. The oxynitride layer may include a silicon oxynitride (SiON) layer.

Through the above processes, it is possible to simultaneously form the first gate electrode 39A and the plug 39B that are electrically insulated from each other. As a result, a problem caused when forming the plug after forming the gate, e.g., the reduction of the contact area between the plug 39B and the substrate 31 due to byproducts or residues generated in the etching process for the patterning of the gate electrode, can be prevented.

Figure 6D:
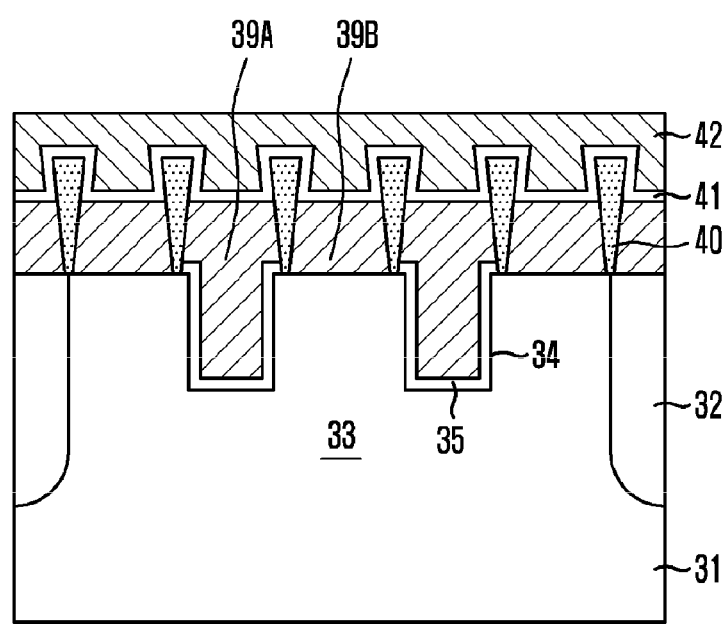

Referring to FIG. 6D, the first gate electrode 39A and the plug 39B are recessed by a certain thickness using the capping layer 40 as an etch barrier. At this time, since the first gate electrode 39A and the plug 39B are formed of the same material, they can be recessed by the same thickness through one recess process.

The recess process is used to secure a space where a second gate electrode is to be formed and may be performed by an overall etching process, e.g., an etch-back process. Herein, the etch depth may be in the range of approximately 1,000 Å to approximately 1,500 Å.

Then, a barrier metal layer 41 and a second conductive layer 42 are sequentially formed on the entire surface of a resultant structure. The barrier metal layer 41 may include a heat resistant metal such as one selected from the group consisting of titanium (Ti), cobalt (Co), molybdenum (Mo), platinum (Pt), iridium (Ir), ruthenium (Ru), chrome (Cr), tantalum (Ta) and zirconium (Zr). The barrier metal layer 41 may include a metal nitride layer formed by combining one of the above heat resistant metal and nitride (N), e.g., a titanium nitride (TiN) layer.

The second conductive layer 42 is used to form a second gate electrode. Therefore, in order to reduce total resistance of the gate electrode, it is preferable to form the second gate electrode with a metallic layer whose conductivity is better than the conductivity of the first gate electrode 39A. The metallic layer may include a tungsten (W) layer, an aluminum (Al) layer, a titanium nitride (TiN) layer, an iridium oxide ($IrO_2$) layer, a titanium silicide (TiSi) layer, a tungsten silicide (WSi) layer, an indium tin oxide (ITO) layer, an indium zinc oxide (IZO) layer or the like.

Figure 6E:
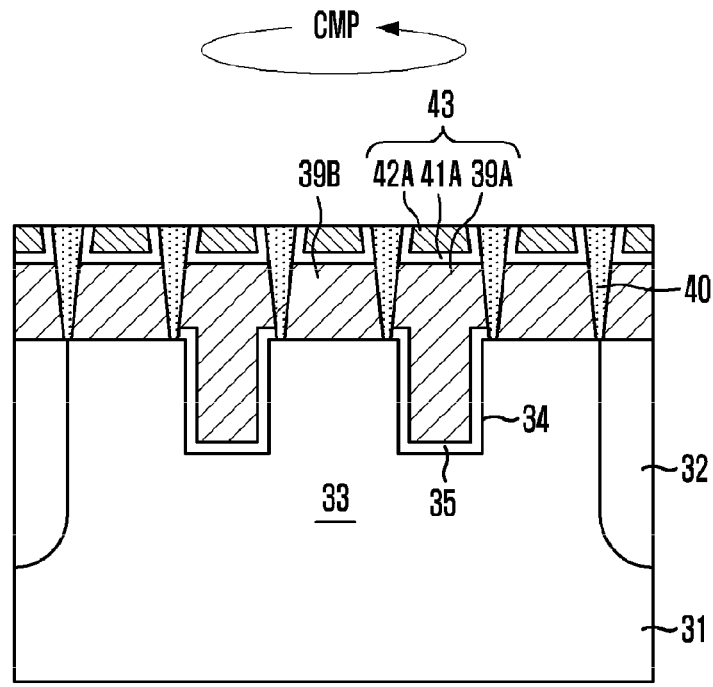

Referring to FIG. 6E, a planarization process is performed until a top surface of the capping layer 40 is exposed. The planarization process may be performed using a chemical mechanical polishing (CMP) method.

Through the above processes, a gate electrode 43 can be formed with the first gate electrode 39A and the second gate electrode 42A that are sequentially stacked. The gate electrode 43 includes a barrier metal pattern 41A disposed between the second gate electrode 42A and the first gate electrode 39A and between the second gate electrode 42A and the capping layer 40.

The barrier metal pattern 41A prevents the diffusion from occurring between the first gate electrode 39A and the second gate electrode 42A. Together with the capping layer 40, the barrier metal pattern 41A extends to the capping layer 40 and the second gate electrode 42A effectively prevents oxidation of the second gate electrode 42A formed of the metallic layer during subsequent processes. In case of forming the gate through one time etching after forming a stack layer for the gate, since the barrier metal pattern 41A remains only at an interface between two electrodes, the barrier metal pattern 41A cannot prevent impurities, e.g., oxygen elements, from infiltrating into the sidewall of the gate during subsequent processes.

Figure 6F:
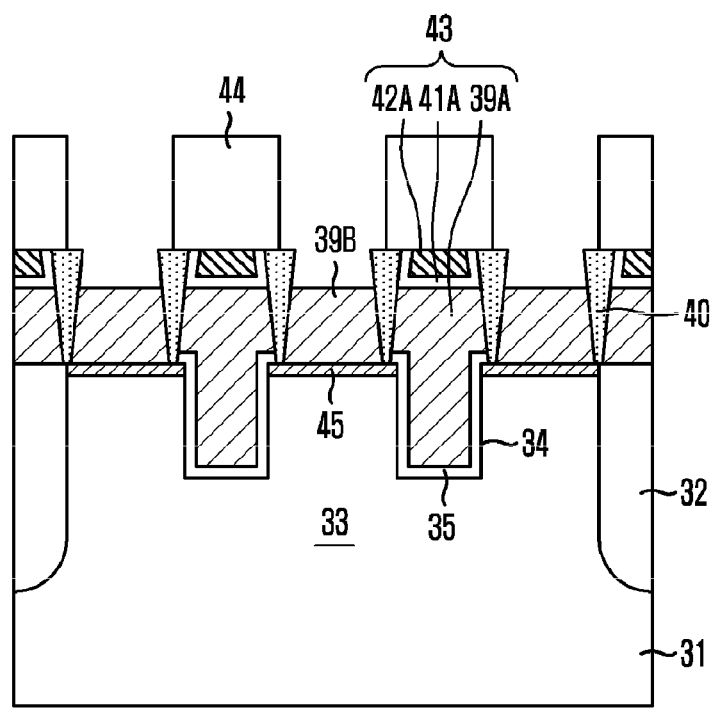

Referring to FIG. 6F, after forming an insulation layer for a gate hard mask on a whole surface of a resultant structure, a photoresist pattern (not shown) is formed on the insulation layer for the gate hard mask using a gate mask. The insulation layer for the gate hard mask may include one selected from an oxide layer, a nitride layer, an oxynitride layer and a stack structure thereof.

Then, a gate hard mask layer 44 is formed on the gate electrode 43 by etching the insulation layer for the gate hard mask using the photoresist pattern as an etch barrier. In particular, the gate hard mask layer 44 is formed on the second gate electrode 42A that is formed on the first gate electrode 39A. At this time, a sidewall of the gate hard mask layer 44 may extend to a top surface of the capping layer 40.

Herein, since the capping layer 40 has an upper portion whose line width W3 is greater than a line width W4 of a lower portion, and the sidewall of the gate hard mask layer 44 is extended to the top surface of the capping layer 40, it is possible to increase an overlay margin in a patterning process of forming the gate hard mask layer 44 and thus to reduce the difficulty of the process.

The barrier metal pattern 41A and the second gate electrode 42A formed on the plug 39B are removed using the gate hard mask layer 44 and the capping layer 40 as an etch barrier. Thus, electrical short circuiting is prevented between the gate electrode 43 and the plug 39B, due to process fallacy, such as micro bridge generation by conductive residues remaining on the top surface of the capping layer 40 during the planarization process of forming the second gate electrode 42A.

Subsequently, an ion implantation process is performed to implant impurities into the plug 39B using the gate hard mask layer 44 and the capping layer 40 as a barrier for the ion implantation. The ion implantation process is performed to reduce the resistance of the plug 39B as well as forming a source and drain region 45 having high doping concentration and a shallow junction depth.

Meanwhile, in case of implanting the impurities when forming the first conductive layer 36, the above ion implantation process may be omitted.

The source and drain region 45 having a shallow junction is formed by performing a heat treatment process to diffuse the impurities doped into the plug 39B at the same time of activating the impurities doped into the plug 39B. As a result, an elevated source/drain structure may be formed. Although it is not shown in figures, after forming a conductive layer on the plug 39B, a planarization process is performed until the gate hard mask layer 44 is exposed, so that a landing plug is formed with the plug 39B and the conductive layer.

In this embodiment, by forming the capping layer 40 having the sidewall with the negative slope, it is possible to form the plug 39B having the sidewall with the positive slope regardless of a shape or profile of the sidewall of the gate electrode 43. As a result, the contact area between the plug 39B and the substrate 31 is increased and thus the contact resistance between the plug 39B and the substrate 31 is reduced. Also, the operational speed of the semiconductor device is improved.

In this embodiment, by simultaneously forming the first gate electrode 39A and the plug 39B by patterning the first conductive layer 36, it is possible to prevent a reduction in contact area between the plug 39B and the substrate 31 caused by the byproducts or residues generated during the gate patterning process.

In this embodiment, by forming the barrier metal pattern 41A between the second gate electrode 42A and the capping layer 40, the barrier metal pattern 41A together with the capping layer 40 can prevent oxidation of the second gate electrode 42A formed of the metallic layer. That is, by employing the capping layer having the sidewall with the negative slope, the plug having the sidewall with the positive slope can be formed regardless of the shape or profile of the sidewall of the gate electrode. As a result, the contact area between the substrate and the plug is increased.

In this embodiment, by simultaneously forming the gate electrode and the plug, it is possible to prevent a reduction in contact area between the substrate and the plug, caused by the byproducts or residues generated during the etching process of forming the gate.

As described above, by securing the contact area between the substrate and the plug, the contact resistance between the substrate and the plug can be reduced and thus the operational speed of the semiconductor device can be enhanced.

In one or more embodiments, by employing the barrier metal layer extending to a region between the second gate electrode and the capping layer, the barrier metal layer and the capping layer can effectively prevent oxidation of the second gate electrode formed of the metallic layer.

What is claimed is:

1. A method of fabricating a semiconductor device, the method comprising:
    forming a conductive layer over a substrate;
    forming a photoresist pattern over the conductive layer;
    selectively etching the conductive layer using the photoresist pattern as an etch barrier to form a trench having a sidewall with a negative slope, thereby forming a plug having a sidewall with a positive slope and a gate electrode simultaneously;
    forming a capping layer by filling the trench between the plug and the gate electrode; and
    forming a gate hard mask layer over the gate electrode, wherein a sidewall of the gate hard mask layer extends to a top surface of the capping layer.

2. The method of claim 1, further comprising selectively etching the substrate to form a recess pattern before forming the conductive layer.

3. The method of claim 2, wherein the recess pattern has one shape selected from the group consisting of rectangle, polygon, a bulb type, a fin type and a saddle-fin type.

4. The method of claim 1, wherein a sidewall of the capping layer has a negative slope.

5. The method of claim 1, wherein the capping layer includes one of an oxide layer, a nitride layer, an oxynitride layer, and a stack structure thereof.

6. The method of claim 1, wherein the conductive layer includes a silicon layer.

7. A method of fabricating a semiconductor device, the method comprising:
    forming a first conductive layer over a substrate;
    selectively etching the first conductive layer to simultaneously form a first gate electrode and a plug whose sidewall has a positive slope;
    forming a capping layer between the plug and the first gate electrode;
    recessing the plug and the first gate electrode by a certain thickness using the capping layer as an etch barrier, thereby forming a resultant structure;
    sequentially forming a barrier metal layer and a second conductive layer over a whole surface of the resultant structure;
    performing a planarization process until the capping layer is exposed, thereby forming a second gate electrode; and
    forming a gate hard mask layer over the second gate electrode that is formed over the first gate electrode, wherein a sidewall of the gate hard mask layer extends to a top surface of the capping layer.

8. The method of claim 7, further comprising removing the second gate electrode and the barrier metal layer formed over the plug using the gate hard mask layer and the capping layer as an etch barrier.

9. The method of claim 7, before forming the first conductive layer, further comprising selectively etching the substrate to form a recess pattern.

10. The method of claim 9, wherein the recess pattern has a shape selected from the group consisting of rectangle, polygon, a bulb type, a fin type and a saddle-fin type.

11. The method of claim 7, wherein a sidewall of the capping layer has a negative slope.

12. The method of claim 7, wherein the capping layer includes at least one of an oxide layer, a nitride layer, an oxynitride layer, and a stack structure thereof.

13. The method of claim 7, wherein simultaneously forming the first gate electrode and the plug comprises:
  forming a photoresist pattern over the first conductive layer; and
  etching the first conductive layer using the photoresist pattern as an etch barrier to form a trench having a sidewall with a negative slope.

14. The method of claim 7, wherein the first conductive layer includes a silicon layer.

15. The method of claim 7, wherein the second conductive layer includes a metallic layer.

* * * * *